United States Patent
Fan et al.

(10) Patent No.: US 12,451,902 B1
(45) Date of Patent: Oct. 21, 2025

(54) LOW POWER TIME-INTERLEAVING DAC WITH PSEUDO INTERLEAVED ARCHITECTURE

(71) Applicant: MARVELL ASIA PTE LTD, Singapore (SG)

(72) Inventors: Liang Fan, Irvine, CA (US); Afshin Mellati, Irvine, CA (US); Quanli Lu, Irvine, CA (US); Espen Olsen, Irvine, CA (US); Linghsiao Wang, Irvine, CA (US); Cindra Abidin, Irvine, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 172 days.

(21) Appl. No.: 18/501,498

(22) Filed: Nov. 3, 2023

Related U.S. Application Data

(60) Provisional application No. 63/422,147, filed on Nov. 3, 2022.

(51) Int. Cl.
*H03M 1/82* (2006.01)

(52) U.S. Cl.
CPC .................................. *H03M 1/82* (2013.01)

(58) Field of Classification Search
CPC ....................................................... H03M 1/82
See application file for complete search history.

(56) References Cited

U.S. PATENT DOCUMENTS

| | | | | |
|---|---|---|---|---|
| 6,081,218 A | * | 6/2000 | Ju | H03M 1/0682 341/150 |
| 9,966,969 B1 | * | 5/2018 | Engel | H03M 1/662 |
| 10,171,102 B1 | * | 1/2019 | Shibata | H03M 3/30 |
| 10,911,029 B1 | * | 2/2021 | Velazquez | H03M 1/0626 |
| 11,563,428 B1 | * | 1/2023 | Singh | H03K 5/1508 |
| 2003/0128142 A1 | * | 7/2003 | Khalil | H03M 1/662 341/144 |
| 2004/0119621 A1 | * | 6/2004 | Khoini-Poorfard | H03M 1/0678 341/141 |
| 2024/0080053 A1 | * | 3/2024 | Velazquez | H04B 1/525 |

* cited by examiner

*Primary Examiner* — Lam T Mai

(57) ABSTRACT

A time-interleaved digital-to-analog converter for an optical transmitter includes a DAC core having a plurality of slices and current sources for converting complementary data signals to analog signals at output nodes of the DAC core, a down switch circuitry configured to connect, for each slice of the DAC core, a current from one of the current sources to a first data input path or a second data input path respectively corresponding to first complementary data signals and second complementary data signals supplied to the slice of the DAC core, an up switch circuitry configured to connect the current to the output nodes, and a data switch circuitry configured to, for each slice of the DAC core, selectively connect the current received via the down switch circuitry and either the first data input path or the second data input path.

20 Claims, 4 Drawing Sheets

LOW POWER TIME-INTERLEAVING DAC WITH PSEUDO INTERLEAVED ARCHITECTURE

CROSS-REFERENCE TO RELATED APPLICATION

This application claims the benefit of U.S. Provisional Application No. 63/422,147 filed on Nov. 3, 2022. The entire disclosure of the application referenced above is incorporated herein by reference.

BACKGROUND

The present disclosure relates to high-speed communication techniques. More particularly, the present disclosure provides a time-interleaved digital-to-analog converter in high-speed coherent communication system.

A high-speed coherent optical transmitter may utilize a digital-to-analog converter (DAC) due to flexible filter and modulation format requirements. In order to meet rising demand for bandwidth, an extremely high sampling rate (~100 GSPS) DAC may be required. Although CMOS technology has advanced significantly, it cannot follow the rising demand for sampling rate. On the other hand, thermal management of the optical circuitry limits the maximum power for the optical transmitter. Although sampling rate requirements are increasing, power consumption budget typically remains the same or is decreased.

Time interleaving techniques have been widely adopted to address challenges related to higher sampling rates. However, existing time interleaving techniques used in the DAC to address demand for high sampling rates may not be suitable for maintaining low power and high bandwidth. Therefore, an improved time-interleaving DAC is desired.

BRIEF SUMMARY OF THE INVENTION

The present disclosure relates to high-speed communication techniques. More particularly, the present disclosure provides an improved time-interleaving digital-to-analog converter with an interleaving factor of N and low power consumption. Merely by example, the time-interleaving digital-to-analog converter with a pseudo interleaved architecture demonstrates a 50% or more reduction in total current in high-speed data communication applications, though other applications are possible. Specifically, the time-interleaving digital-to-analog converter (DAC) with the pseudo interleaved architecture comprises one switch (UP switch) in a DAC core slice and another switch (Down switch) that is added to switch between two data flows. Each output data is timed by a rising clock edge using UP switch and a falling clock edge using Down switch. Thus, driving N slices of the DAC using very narrow pulse width signals is eliminated and N/2 phases of complementary clocks with frequency of Fs/N are used, where Fs is a sampling frequency of the DAC. Further, as described below, data is output from the DAC by current mode AND logic of two slow clocks, which are easier to generate and distribute than very narrow pulse width signals. Also, the pseudo interleaved architecture reuses (shares) current sources between two data flows of two slices, which reduces the current sources by half.

In modern electrical interconnect systems, high-speed serial links have replaced parallel data buses, and serial link speed is rapidly increasing due to the evolution of CMOS technology. Internet bandwidth has been doubling almost every two years following Moore's Law. However, Moore's Law is predicted to come to an end in the not too distant future. Standard CMOS silicon transistors will stop scaling around 3 nm and internet bandwidth increases due to process scaling will plateau. However, Internet and mobile applications require a huge amount of bandwidth to accommodate transferring photo, video, music, and other multimedia files, and it is predicted that the demand for bandwidth will continue to grow. This disclosure describes techniques and methods to improve the communication bandwidth beyond applicability of Moore's law.

A time-interleaved digital-to-analog converter (TIDAC) for an optical transmitter includes a DAC core having a plurality of slices and corresponding current sources respectively for converting complementary data signals to analog signals at output nodes of the DAC core, a down switch circuitry configured to connect, for each slice of the DAC core, a current from a corresponding one of the current sources to either a first data input path or a second data input path, the first data input path corresponding to first complementary data signals supplied to the slice of the DAC core and the second data input path corresponding to second complementary data signals supplied to the slice of the DAC core, an up switch circuitry configured to connect the current to the output nodes of the DAC, and a data switch circuitry configured to, for each slice of the DAC core, selectively connect the current received from the corresponding one of the current sources via the down switch circuitry and either the first data input path or the second data input path such that each of the current sources supplies current for the first complementary data signals and the second complementary data signals.

The present disclosure achieves these benefits and others in the context of known coherent optical transmitter technology. However, a further understanding of the nature and advantages of the present disclosure may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION

The present disclosure relates to high-speed communication techniques. More particularly, the present disclosure provides an improved time-interleaving digital-to-analog converter with an interleaving factor of N and low power consumption. Merely by example, the time-interleaving digital-to-analog converter with a pseudo interleaved architecture demonstrates a 50% or more reduction in total current in high-speed data communication applications, though other applications are possible.

The following description is presented to enable one of ordinary skill in the art to make and use the disclosure and to incorporate it in the context of particular applications. Various modifications, as well as a variety of uses in different applications will be readily apparent to those skilled in the art, and the general principles defined herein may be applied to a wide range of embodiments. Thus, the present disclosure is not intended to be limited to the embodiments presented, but is to be accorded the widest scope consistent with the principles and novel features disclosed herein.

In the following detailed description, numerous specific details are set forth in order to provide a more thorough understanding of the present disclosure. However, it will be apparent to one skilled in the art that the present disclosure may be practiced without necessarily being limited to these specific details. In other instances, well-known structures and devices are shown in block diagram form, rather than in detail, in order to avoid obscuring the present disclosure.

A time-interleaved digital-to-analog converter (TIDAC) according to the present disclosure is configured to convert digital data to an analog signal by using multiple DAC core slices, each of which is operating at a lower rate than a transmission rate of the digital data. For example, N slices of a DAC core running at Fs/N rate can be interleaved by clock signals to achieve a sampling frequency of Fs. The sampling rate Fs can be much higher than what can be obtained with just one slice of the DAC core.

Figure 1:
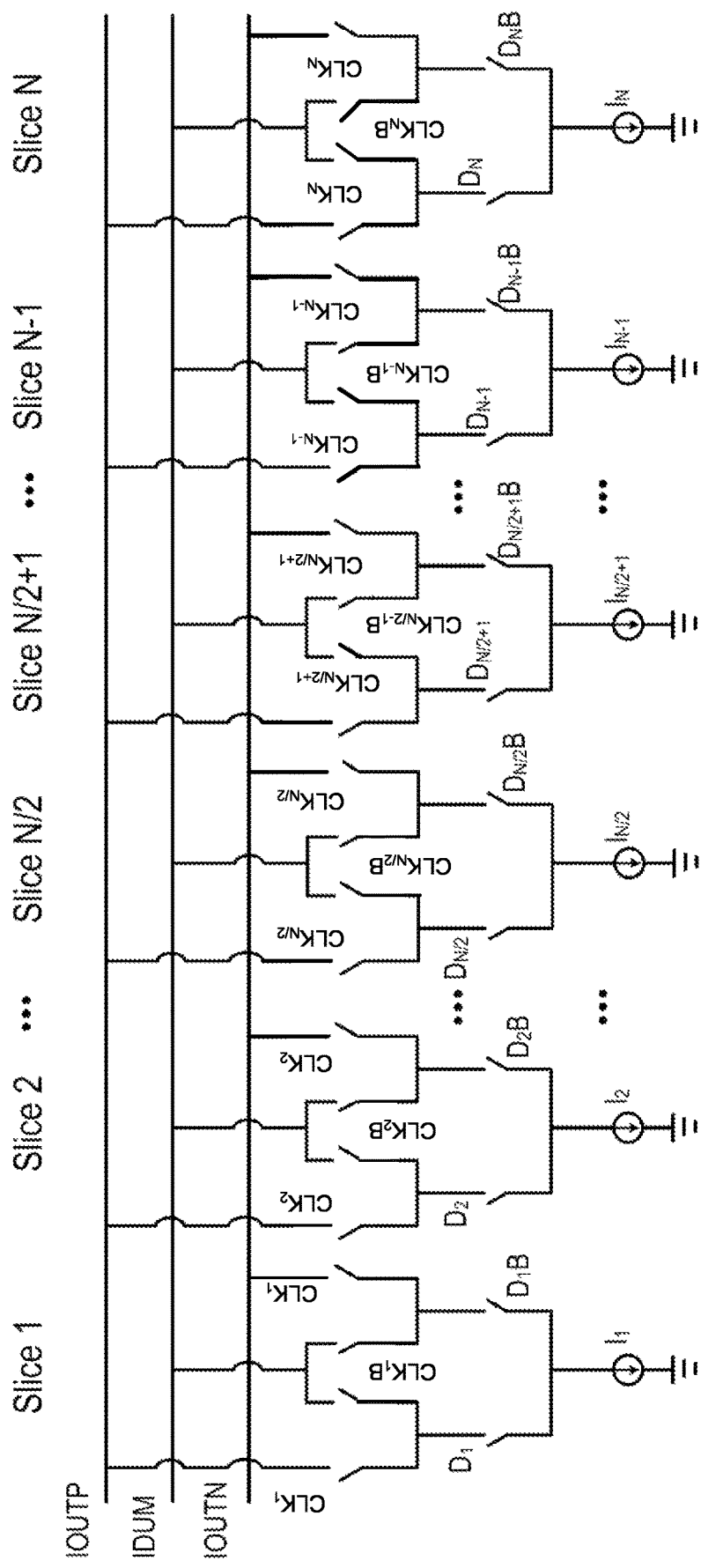
FIG. 1 is a simplified diagram of a conventional time-interleaving digital-to-analog converter (TIDAC).

FIG. 1 is a simplified diagram of a conventional time-interleaving digital-to-analog converter (TIDAC). As shown, the TIDAC is running in a current mode to convert digital data to an analog signal by using N slices of the DAC core. All the N slices of the DAC core are cascaded in parallel from Slice 1 to Slice N. N corresponds to an interleaving factor (i.e, the number of slices in the DAC core, which is an integer greater than 1). Each slice includes a current source, $I_n$, which is determined by a required output swing of the analog signal. The digital signal, $D_n$, or DNB (with reversed or complementary phase of $D_n$), drives the input current from each current source. N sets of clock signals $CLK_n$ or $CLK_nB$ (with reversed phase), are respectively applied to the N slices of the DAC core to sample a pair of negative or positive output currents from each slice, which are summed to obtain IOUTP and IOUTN for determining a corresponding analog signal. One shortcoming of this configuration is that every slice of the DAC core needs to consume a current $I_s$ from the corresponding current source $I_n$ (where n=1, 2, . . . , N). For example, if a DAC needs to generate a full-scale current of $I_s$ with the interleaving factor of N, N lower-rate DAC core slices are needed. Thus, total current consumption would be $N \times I_s$, which is high.

Figure 2:
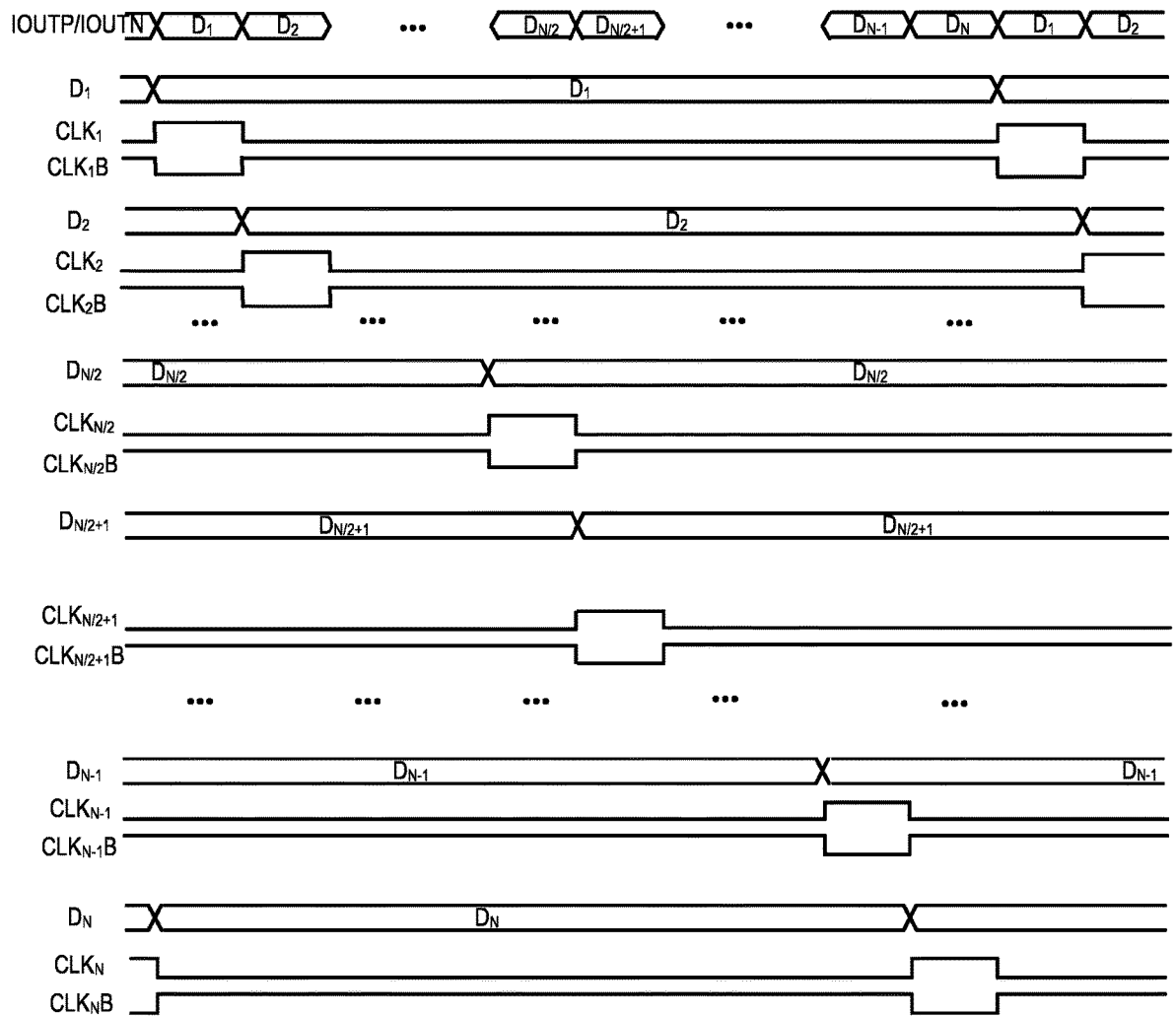
FIG. 2 is a waveform diagram of the clocking scheme associated with the conventional TIDAC of FIG. 1.

FIG. 2 is a waveform diagram of a clocking scheme associated with the conventional TIDAC of FIG. 1. Referring to FIG. 2, for each data signal, e.g., $D_1$, a pair of clock signals, $CLK_1$ and $CLK_1B$, is used to control where (i.e., which output node) a current associated with $D_1$ is sent. Each of these clock signals has a pulse width. For example, data signal $D_1$ is sent to the output nodes when $CLK_1$ is high. The pulse width of the clock signals is decided by the DAC sampling frequency Fs only. In other words, the pulse width is proportional to 1/Fs. The higher the data rate and the sampling frequency Fs are and the smaller 1/Fs is, the smaller the pulse width of the clock signals. The sampling frequency is not reduced by the interleaving factor N. Generating a pulse width 1/Fs consumes considerable power for a given rise/fall time. Moreover, when Fs is very high (~100 GSPS), it is very difficult to achieve the desired pulse width, which becomes very narrow, and which is difficult to generate, particularly with fast rise times.

Figure 3:
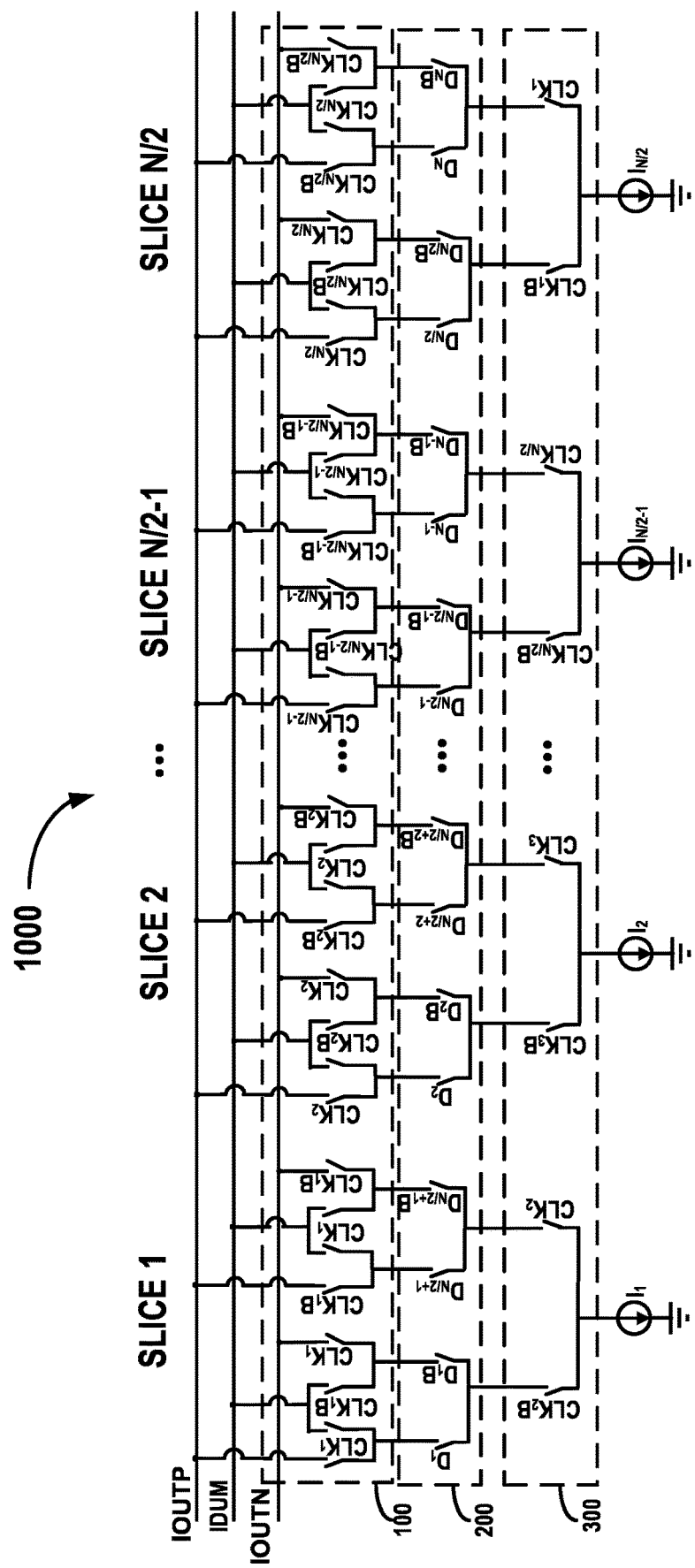
FIG. 3 is a simplified diagram of an improved TIDAC according to an embodiment of the present disclosure.

In an embodiment, the present disclosure provides an improved TIDAC to solve the above limitations by reducing the total current needed for interleaving the N slices of the DAC core and to avoid generating clock signals with an extremely narrow pulse width (e.g., corresponding to 1/100 GSPS). FIG. 3 is a simplified diagram of an improved TIDAC according to an embodiment of the present disclosure. This diagram is merely an example, which should not unduly limit the scope of the claims. One of ordinary skill in the art would recognize many variations, alternatives, and modifications. Referring to FIG. 3, an improved TIDAC 1000 with a pseudo interleaving architecture is provided. In an example, for an interleaving factor of N, the pseudo interleaving architecture of the TIDAC 1000 includes N/2 slices of the DAC core, reducing total current by 50% of a conventional TIDAC. More reduction may be possible as the embodiment is generalized under the same architecture.

In an example shown in FIG. 3, the TIDAC 1000 includes a down switch circuitry 300 per slice of the DAC core including N/2 pairs of switches coupled to a total of N/2 current sources. For each slice of the DAC core, the down switch circuitry 300 correspondingly includes a pair of switches to direct the current from one current source (e.g., $I_1$) respectively to two data input paths controlled by a pair of clock signals, e.g., $CLK_2B$ and $CLK_2$, which are complementary to each other. In a specific embodiment, the pair of clock signals is selected for N/2 pairs of complementary clock signals for driving the pair of switches in one slice of the series of N/2 slices. The N/2 pairs of complementary clock signals are provided as a series of clock signals, which can be denoted by a serial number for each clock signal matching the serial number of slices, having sequential time delay from one pair to next pair as the serial number sequentially increases one by one. For example, N/2 pairs of complementary clock signals are provided as a series of clock signals having sequential time delay from one pair to next pair as the serial number sequentially increases one by one can be generated using a delay line. For example, clock signals $CLK_1$ and $CLK_1B$ can be input to the delay line, which can then output clock signals $CLK_2B$ and $CLK_2$ that are delayed relative to the clock signals $CLK_1$ and $CLK_1B$, output clock signals $CLK_3B$ and $CLK_3$ that are delayed relative to the clock signals $CLK_2B$ and $CLK_2$, and so on. In some embodiments, series-connected logic gates can be employed instead of a delay line to provide the delay.

For example, for Slice 1, the two clock signals are selected (e.g., from the outputs of a delay line) with a serial number 2, i.e., complementary pair of $CLK_2B$ and $CLK_2$ which have a time delay relative to $CLK_1$ and $CLK_1B$. For Slice 2, the two clock signals are selected as a complementary pair of $CLK_3B$ and $CLK_3$, which have a time delay relative to $CLK_2$ and $CLK_2B$, and so on. Optionally, the time delay from one clock signal to a next may be the same or not the same for all N/2 clock signals. Optionally, the time delay can be designed to be very small to meet requirements for high-speed communication applications without the need to limit a narrow pulse width to each signal itself. Finally, for Slice N/2, the two clock signals are selected with a corresponding serial number shifted back to 1, i.e., a first complementary pair of $CLK_1B$ and $CLK_1$. The selection of the two clock signals for the pair of switches from the N/2 pairs of switches for the corresponding slice in the series of N/2 slices can be optionally configured to shift the serial number by two or more per slice. In the conventional TIDAC (see example of FIG. 1), there is no such down switch circuitry. The down switch circuitry 300, in the example of FIG. 3, forms N/2 1×2 multiplexers in a pseudo interleaved architecture to control switching between two current (or data) flows, which allows the number of current sources to be reduced from N to N/2 and the number of slices of DAC core also to be reduced to N/2. Accordingly, total current consumption is reduced by 50%. The interleaved architecture of the DAC described in the present disclosure is not limited sharing one current source between two slices. For example, in some embodiments, one current source can be shared between more than two slices, and corresponding delayed clock signals can be generated to realize 1×M multiplexing (M>2) using the methodology described above. In some embodiments, the down switch circuitry 300 may include more switches corresponding to each slice, and may further reduce the total current. More functions of the down switch circuitry 300 with multiple switches controlled by respective clock signals with a shifted time-delay per slice of DAC core can be seen in a signal waveform diagram shown in FIG. 4 below.

Referring to FIG. 3, the TIDAC 1000 further includes a data switch circuitry 200 including N pairs of data switches respectively controlled by N pairs of data signals for the N/2 slices of the DAC core, each pair of data signals being set to be complementary to each other. The N/2 Slices of the DAC core are configured to convert these N complementary data signals sequentially in time to respective analog signals. For each slice of the DAC core, the data switch circuitry 200 includes two pairs of data switches, each pair coupled to one of the two data input paths of current from the down switch circuitry 300 in the same slice of the DAC core to select the current from the one of two data input paths and to direct the selected current to one of two data output paths. There are in total four data output paths for each slice of the DAC core. In a specific embodiment, for each slice, the two pairs of data signals selected for controlling the two pairs of data switches are selected from two pairs of complementary data signals with corresponding serial numbers. The complementary data signals are supplied in a serial time order identified by the serial number, i.e., 1, 2, . . . , N/2, N/2+1, . . . , N−1, N. For example, the first pair of complementary data signals, $D_1$ and $D_1B$, and the (N/2+1)th pair of complementary data signals, $D_{N/2+1}$ and $D_{N/2+1}B$, are selected for respectively controlling the two pairs of data switches in the Slice 1 of the DAC core. Similarly, the second pair of complementary data signals, $D_2$ and $D_2B$, and the (N/2+2)-th pair of data signals, $D_{N/2+2}$ and $D_{N/2+2}B$, are selected for respectively controlling the two pair of data switches in the Slice 2 of the DAC core, and so on. Finally, the N/2-th pair of complementary data signals, $D_{N/2}$ and $D_{N/2}B$, and the N-th pair of complementary data signals, $D_N$ and $D_NB$, are selected for respectively controlling the two pair of data switches in the Slice N/2 of the DAC core. The serial numbers of the pair of data signals may be selected to be far apart in each slice to make pulse widths of clock signals in each slice of the DAC core as wide as possible, which is more suitable for high-speed data communication applications. For example, the serial numbers of adjacent data signals in a pair are not directly sequential and may be separated by a value of two or more.

Referring again to FIG. 3, the TIDAC 1000 also includes an up switch circuitry 100 per slice of the DAC core coupled between the data switch circuitry 200 and the output nodes (a negative node IOUTN, a positive node IOUTP, and a dummy node IDUM). The IOUTP and IOUTN outputs are used to determine a swing of a respective analog signal. In an embodiment, the up switch circuitry 100 includes four pairs of switches per slice of the DAC core that are operated as follows. A first pair is respectively controlled by two clock signals with opposite phases and configured to deliver the current from a first data output path to either a positive DAC output node IOUTP or a dummy output node IDUM. A second pair is respectively controlled by the same two clock signals and configured to deliver the current from a second data output path to either a negative DAC output node IOUTN or the dummy output node IDUM. A third pair is respectively controlled by the same two clock signals and configured to deliver the current from a third data output path to either a positive DAC output node IOUTP or a dummy output node IDUM. A fourth pair is respectively controlled by the same two clock signals and configured to deliver the current from a fourth data output path to either a negative DAC output node IOUTN or the dummy output node IDUM. For the first slice, Slice 1, the two clock signals are $CLK_1$ and $CLK_1B$, complementary to each other. The clock signal $CLK_1B$ is used to control one switch of a first pair of switches and one switch of a second pair of switches for connecting the current from either the first data output path or the second data output path to the dummy output node. The clock signal $CLK_1$ is used to control one switch of a third pair of switches and one switch of a fourth pair of switches for connecting the current from either the third data output path or the fourth data output path to the dummy output node.

In general, unlike the conventional TIDAC where the output data is timed by a rising edge and a falling edge of a same clock signal from one switch circuitry (e.g., an up switch circuitry), the TIDAC 1000 according to the present disclosure is configured to control timing of each output data by setting the data pulse with a rising edge of the positive clock signal from the up switch circuitry 100 and with a falling edge of the negative clock signal with a shifted serial number from the down switch circuitry 300. For example, as seen in FIG. 4, output data D1 is output from rising and falling edges of clock signals $CLK_1$ and $CLK_1B$ to falling and rising edges of clock signals $CLK_2B$ and $CLK_2$; output data D2 is output from rising and falling edges of clock signals $CLK_2$ and $CLK_2B$ to falling and rising edges of clock signals $CLK_3B$ and $CLK_3$; and so on.

Figure 4:
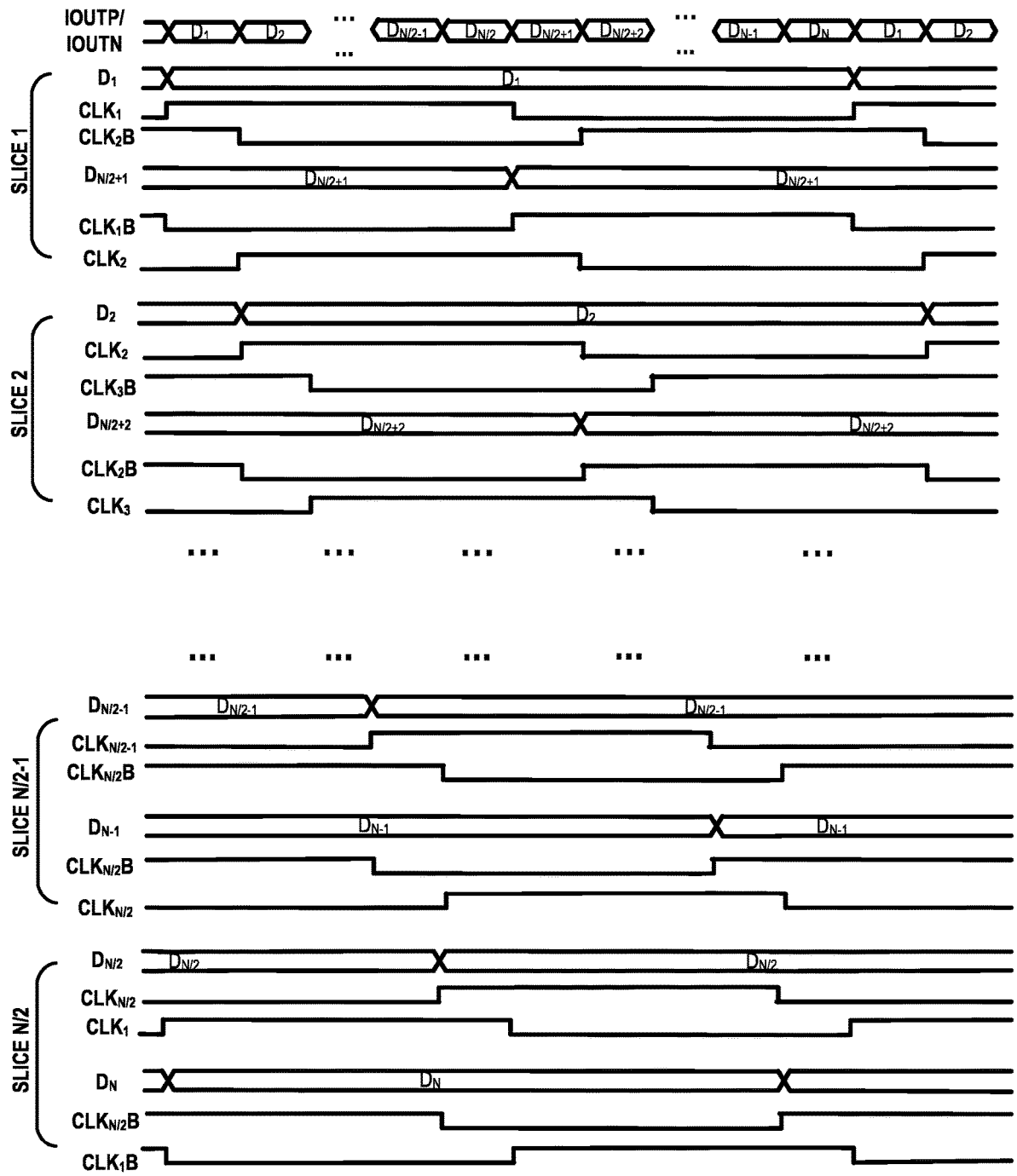
FIG. 4 is a waveform diagram of the clocking scheme associated with the TIDAC of FIG. 3 according to an embodiment of the present disclosure.

FIG. 4 is a waveform diagram of the clocking scheme associated with the TIDAC 1000 of FIG. 3 according to an embodiment of the present disclosure. This diagram is merely an example, which should not unduly limit the scope of the claims. One of ordinary skill in the art would recognize many variations, alternatives, and modifications. For example, data $D_1$ and data $D_{N/2+1}$ are the pair of data signals to be selected in Slice 1. The design of the TIDAC 1000 allows the rising edge of the clock signal $CLK_1$ for the switch and the falling edge of clock signal $CLK_2B$ for the switch to determine the data signal $D_1$ that is sent out to the DAC output nodes. In the same Slice 1, the rising edge of $CLK_1B$ (which has a same timing as the falling edge of $CLK_1$) for the switch and the falling edge of $CLK_2$ (which has a same timing as the rising edge of $CLK_2B$) for the switch are used to determine the data signal $D_{N/2+1}$ sent to DAC output nodes. Similarly, data $D_2$ and data $D_{N/2+2}$ are sent via Slice 2 to the DAC output nodes. Among N/2 pair of data signals in a series of N data signals, on running average, the pair of data $D_1$ and data $D_{N/2+1}$ are farthest apart in timing among all the N data signals. The same relationship applies to the pair of $D_2$ and $D_{N/2+2}$, or the pair of $D_3$ and $D_{N/2+3}$, or the pair of $D_{N/2}$ and $D_N$. Thus, in this pseudo time-interleaving design, the two clock signals, $CLK_1$ (and $CLK_1B$) and $CLK_2$ (and $CLK_2B$) in the Slice 1 of the DAC core can be configured to have the widest pulse width that matches the timing difference between the pair of data signals $D_1$ and $D_{N/2+1}$. The pseudo time-interleaving design facilitates generating a driving clock having a pulse width that is considerably less narrow (more wide) than in a conventional TIDAC. This effectively eliminates the requirement for a driving clock signal with a very narrow pulse width as in a conventional TIDAC.

Additionally, both the up switch circuitry 100 and the down switch circuitry 300 are configured to use a same set of clock signals with N/2 phases of complementary clocks with a frequency of Fs/N. Effectively, the narrow pulse width in the voltage domain is eliminated and converted to the current domain. Data is sent to output in accordance with a current mode AND logic operation of corresponding complementary clocks provided to the down switch circuitry 300 and the up switch circuitry 100. In other words, as shown in FIGS. 3 and 4, each of the clocks $CLK_2B$ and $CLK_1$ is required to be high to pass the data corresponding to $D_1$ to the IOUTP DAC output, each of the clocks $CLK_2$ and $CLK_1B$ is required to be high to pass the data corresponding to $D_{N/2+1}$ to the IOUTP DAC output, etc. Accordingly, each of the first clock $CLK_1$ and the second clock $CLK_2B$ can have a much wider pulse width and is more easily generated and distributed such that the falling edge of $CLK_2B$ is close enough to the rising edge of $CLK_1$ to form the clock signal for sending data $D_1$ to the DAC output. In a specific embodiment, assuming the data packet series $D_1$, $D_2, \ldots, D_{N/2}, D_{N/2+1}, \ldots, D_{N-1}$, and $D_N$ is sent by the TIDAC 1000, the pulse width of $CLK_1B$ (which is opposite in phase relative to $CLK_1$) and $CLK_2$ (which is opposite in phase relative to $CLK_2B$) can be maximized to set its rising edge of $CLK_1B$ with the falling edge of $CLK_2$ to form the clock signal for sending data $D_{N/2+1}$ to the DAC output. With this timing, $D_1$ is first sent via Slice 1 of the DAC core, $D_2$ is secondly sent via Slice 2, $\ldots, D_{N/2}$ is N/2-th sent via Slice N/2, then $D_{N/2+1}$ is sent via Slice 1 again. Furthermore, the architecture of the TIDAC 1000 reuses the same current source between two data flows, which saves half of current source arrays.

For a higher interleaving factor N, the pseudo interleaved architecture of the TIDAC 1000 can be modified to allow higher reduction of power. A lower speed AND logic operation can be performed in the voltage mode and a higher speed AND logic operation can be performed in the current mode.

In general terms, the time-interleaved digital-to-analog converter (TIDAC) according to the present disclosure has high sampling rate (~100 GSPS) and can be used in optical transmitters. The TIDAC comprises a DAC core, down switch circuitry, up switch circuitry, and data switch circuitry. The DAC core comprises a plurality of slices and corresponding current sources respectively for converting complementary digital data signals to analog signals at output nodes of the DAC core. The down switch circuitry is configured to connect, for each slice of the DAC core, a current from a corresponding one of the current sources to either a first data input path or a second data input path, the first data input path corresponding to first complementary data signals supplied to the slice of the DAC core and the second data input path corresponding to second complementary data signals supplied to the slice of the DAC core. The up switch circuitry is configured to connect the current to the output nodes of the DAC. The data switch circuitry is configured to, for each slice of the DAC core, selectively connect the current received from the corresponding one of the current sources via the down switch circuitry and either the first data input path or the second data input path such that each of the current sources supplies current for the first complementary data signals and the second complementary data signals.

The TIDAC has a time-interleaving factor of N, where N is an integer greater than 1. The TIDAC comprises N/2 of the slices of the DAC core and N/2 of the current sources. The down switch circuitry comprises a single pair of switches for each of the N/2 slices of the DAC core, each pair of switches being controlled by a respective pair of N/2 complementary clock signals to connect the current from the corresponding one of the current sources to either the first data input path or the second data input path. The up switch circuitry comprises four pairs of switches for each of the N/2 slices of the DAC core, each of the four pairs of switches being controlled by a respective pair of the N/2 complementary clock signals to connect the current to the output nodes of the DAC. The data switch circuitry comprises two pairs of data switches per each of the N/2 slices of the DAC core, each of the two pairs of data switches being controlled by a respective pair of N complementary data signals for controlling the current sent to the output nodes of the DAC.

The N/2 pairs of complementary clock signals are provided as a series of clock signals with clock phases sequentially delayed relative to one another. The N/2 slices of the DAC core consumes a total current equal to $N/2 \times I_s$ for converting N data signals at a sampling rate of Fs, wherein the $I_s$ is a full-scale current per slice of the DAC core operating at a sampling rate of Fs/N.

The pair of switches of the down switch circuitry in an i-th slice of the DAC core, where i is an index such as 1, 2, 3, etc., is driven by an (i+1)-th pair of the N/2 complementary clock signals to alternatively connect an i-th one of the N/2 current sources to either the first data input path or the second data input path in the i-th slice of the DAC core, where i varies from 1 to N/2, and the pair of switches in the N/2-th slice of the DAC core is driven by a first pair of the N/2 complementary clock signals.

A first pair of the N complementary data signals supplied for the first pair of data switch in the i-th slice of the DAC core is an i-th pair of the N complementary data signals to be selected in an i-th order in time and a second pair of the N complementary data signals in the same slice is an (N/2+i)-th pair of the N complementary data signals to be selected in a (N/2+i)-th order in time with N/2 delays relative to the i-th order in time. Each pair of switches of the up switch circuitry in an i-th slice of the DAC core is driven by the i-th pair of the N complementary clock signals. In the i-th slice of the DAC core the pair of switches is driven by the (i+1)-th pair of the N complementary clock signals having an i-th delay in clock phase relative to the i-th pair of the N complementary clock signals.

In the i-th slice of the DAC core, a positive one of the i-th pair of the N complementary clock signals in the up switch circuitry has a rising edge and a negative one of the (i+1)-th pair of the N complementary clock signals in the down switch circuitry has a falling edge with the i-th delay in clock phase to select the i-th pair of complementary data signals supplied in the data switch circuitry. In the i-th slice of the DAC core, a negative one of the i-th pair of the N complementary clock signals in the up switch circuitry has a rising edge and a positive one of the (i+1)-th pair of the N complementary clock signals in the down switch circuitry has a falling edge with the i-th delay in clock phase to select the (N/2+i)-th pair of complementary digital signals supplied in the data switch circuitry.

The i-th slice of DAC core is configured to have a pulse width of each of the i-th pair of the N complementary clock signals and the (i+1)-th pair of the N complementary clock signals to be maximized to the N/2 delays between the (N/2+i)-th pair of the N complementary data signals and the i-th pair of the N complementary data signals. The i-th slice of the DAC core is configured to convert the positive one of the i-th pair of complementary data signals to a first current signal at a positive one of the output nodes of the DAC and to convert the negative one of the i-th pair of complementary data signals to a second current signal at a negative one of the output nodes of the DAC. The i-th slice of the DAC core is configured to convert the positive one of the (N/2+i)-th pair of complementary data signals to a first current signal at a positive one of the output nodes of the DAC and to convert the negative one of the (N/2+i)-th pair of complementary data signals to a second current signal at a negative one of the output nodes of the DAC.

Further, in general terms, the time-interleaved digital-to-analog converter (TIDAC) of the present disclosure can be operated using the following method. The method comprises supplying current from a plurality of current sources to respective slices of a DAC core, the current being configured to convert complementary digital data signals to analog signals at output nodes of the DAC core. The method comprises connecting, for each slice of the DAC core, a current from a corresponding one of the current sources to either a first data input path or a second data input path of the DAC core, the first data input path corresponding to first complementary data signals supplied to the slice of the DAC core and the second data input path corresponding to second complementary data signals supplied to the slice of the DAC core. The method comprises connecting the current to the output nodes of the DAC; and for each slice of the DAC core, selectively connecting the current received from the corresponding one of the current sources and either the first data input path or the second data input path such that each of the current sources supplies current for the first complementary data signals and the second complementary data signals.

The method further comprises providing N/2 of the current sources and providing N/2 of the slices of DAC core based on the N/2 current sources respectively for converting N complementary data signals in sequential time order to analog signals at output nodes of the DAC core. The method further comprises coupling a down switch circuitry comprising one pair of switches per slice of the DAC core to the N/2 current sources. The method further comprises controlling the pair of switches of the down switch circuitry in the slice of the DAC core respectively using a respective pair of N/2 complementary clock signals to connect a current from one of the N/2 current sources to either the first data input path or the second data input path. The method further comprises configuring an up switch circuitry with four pairs of switches per slice of the DAC core and configuring a data switch circuitry with two pairs of data switches per slice of the DAC core to alternately connect the current from the first data input path or the second data input path to the output nodes of the DAC.

The method further comprises providing the N/2 pairs of complementary clock signals in the up switch circuitry and the down switch circuitry as a series of clock signals with clock phases sequentially delayed relative to one another.

In the method, controlling the pair of switches in the down switch circuitry per slice of the DAC core comprises driving the pair of switches in an i-th slice of the DAC core by an (i+1)-th pair of the N/2 complementary clock signals to alternatively connect an i-th one of the N/2 current sources to either the first data input path or the second data input path in the i-th slice of the DAC core, wherein i varies from 1 to N/2, and the pair of switches in the N/2-th slice of the DAC core is driven by a first pair of the N/2 complementary clock signals.

In the method, configuring the data switch circuitry per slice of the DAC core comprises supplying a first pair of the N complementary data signals to the first pair of data switch in the i-th slice of the DAC core with an i-th pair of the N complementary data signals in an i-th order in time and supplying a second pair of the N complementary data signals in the same slice with a (N/2+i)-th pair of the N complementary data signals in a (N/2+i)-th time order with N/2 delays relative to the i-th order in time.

In the method, configuring the up switch circuitry per slice of the DAC core comprises controlling each pair of switches of the up switch circuitry in an i-th slice of the DAC core by the i-th pair of the N complementary clock signals, wherein in the i-th slice of the DAC core the (i+1)-th pair of the N complementary clock signals for driving the pair of switches of the down switch circuitry has an i-th delay in clock phase relative to the i-th pair of the N complementary clock signals.

In the method, controlling each pair of switches of the up switch circuitry in the i-th slice of the DAC core further comprises using the i-th delay in clock phase between a rising edge of a positive one of the i-th pair of the N complementary clock signals in the up switch circuitry and a falling edge of a negative one of the (i+1)-th pair of the N complementary clock signals in the down switch circuitry to select the i-th pair of complementary digital signals supplied in the data switch circuitry.

In the method, controlling each pair of switches of the up switch circuitry in the i-th slice of the DAC core further comprises using the i-th delay in clock phase between a rising edge of a negative one of the i-th pair of the N complementary clock signals in the up switch circuitry and a falling edge of a positive one of the (i+1)-th pair of the N complementary clock signals in the down switch circuitry to select the (N/2+i)-th pair of complementary digital signals supplied in the data switch circuitry.

While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. A time-interleaved digital-to-analog converter (TIDAC) for an optical transmitter, the TIDAC comprising:
    a DAC core having a plurality of slices and corresponding current sources respectively for converting complementary digital data signals to analog signals at output nodes of the DAC core;
    down switch circuitry configured to connect, for each slice of the DAC core, a current from a corresponding one of the current sources to either a first data input path or a second data input path, the first data input path corresponding to first complementary data signals supplied to the slice of the DAC core and the second data input path corresponding to second complementary data signals supplied to the slice of the DAC core;

up switch circuitry configured to connect the current to the output nodes of the DAC; and data switch circuitry configured to, for each slice of the DAC core, selectively connect the current received from the corresponding one of the current sources via the down switch circuitry and either the first data input path or the second data input path such that each of the current sources supplies current for the first complementary data signals and the second complementary data signals.

2. The TIDAC of claim 1 having a time-interleaving factor of N, the TIDAC comprising:

N/2 of the slices of the DAC core; and
N/2 of the current sources,
the down switch circuitry comprising a single pair of switches for each of the N/2 slices of the DAC core, each pair of switches being controlled by a respective pair of N/2 complementary clock signals to connect the current from the corresponding one of the current sources to either the first data input path or the second data input path,
the up switch circuitry comprising four pairs of switches for each of the N/2 slices of the DAC core, each of the four pairs of switches being controlled by a respective pair of the N/2 complementary clock signals to connect the current to the output nodes of the DAC, and
the data switch circuitry comprising two pairs of data switches per each of the N/2 slices of the DAC core, each of the two pairs of data switches being controlled by a respective pair of N complementary data signals for controlling the current sent to the output nodes of the DAC.

3. The TIDAC of claim 2, wherein the N/2 pairs of complementary clock signals are provided as a series of clock signals with clock phases sequentially delayed relative to one another.

4. The TIDAC of claim 3, wherein the pair of switches of the down switch circuitry in an i-th slice of the DAC core is driven by an (i+1)-th pair of the N/2 complementary clock signals to alternatively connect an i-th one of the N/2 current sources to either the first data input path or the second data input path in the i-th slice of the DAC core, wherein i varies from 1 to N/2, and the pair of switches in the N/2-th slice of the DAC core is driven by a first pair of the N/2 complementary clock signals.

5. The TIDAC of claim 4, wherein a first pair of the N complementary data signals supplied for the first pair of data switch in the i-th slice of the DAC core is an i-th pair of the N complementary data signals to be selected in an i-th order in time and a second pair of the N complementary data signals in the same slice is an (N/2+i)-th pair of the N complementary data signals to be selected in a (N/2+i)-th order in time with N/2 delays relative to the i-th order in time.

6. The TIDAC of claim 5, wherein each pair of switches of the up switch circuitry in an i-th slice of the DAC core is driven by the i-th pair of the N complementary clock signals, wherein in the i-th slice of the DAC core the pair of switches is driven by the (i+1)-th pair of the N complementary clock signals having an i-th delay in clock phase relative to the i-th pair of the N complementary clock signals.

7. The TIDAC of claim 6 wherein, in the i-th slice of the DAC core, a positive one of the i-th pair of the N complementary clock signals in the up switch circuitry has a rising edge and a negative one of the (i+1)-th pair of the N complementary clock signals in the down switch circuitry has a falling edge with the i-th delay in clock phase to select the i-th pair of complementary data signals supplied in the data switch circuitry.

8. The TIDAC of claim 6, wherein, in the i-th slice of the DAC core, a negative one of the i-th pair of the N complementary clock signals in the up switch circuitry has a rising edge and a positive one of the (i+1)-th pair of the N complementary clock signals in the down switch circuitry has a falling edge with the i-th delay in clock phase to select the (N/2+i)-th pair of complementary digital signals supplied in the data switch circuitry.

9. The TIDAC of claim 7, wherein the i-th slice of the DAC core is configured to convert the positive one of the i-th pair of complementary data signals to a first current signal at a positive one of the output nodes of the DAC and to convert the negative one of the i-th pair of complementary data signals to a second current signal at a negative one of the output nodes of the DAC.

10. The TIDAC of claim 8, wherein the i-th slice of the DAC core is configured to convert the positive one of the (N/2+i)-th pair of complementary data signals to a first current signal at a positive one of the output nodes of the DAC and to convert the negative one of the (N/2+i)-th pair of complementary data signals to a second current signal at a negative one of the output nodes of the DAC.

11. The TIDAC of claim 6, wherein the i-th slice of DAC core is configured to have a pulse width of each of the i-th pair of the N complementary clock signals and the (i+1)-th pair of the N complementary clock signals to be maximized to the N/2 delays between the (N/2+i)-th pair of the N complementary data signals and the i-th pair of the N complementary data signals.

12. The TIDAC of claim 2, wherein the N/2 slices of the DAC core consumes a total current equal to $N/2 \times I_s$ for converting N data signals at a sampling rate of Fs, wherein the $I_s$ is a full-scale current per slice of the DAC core operating at a sampling rate of Fs/N.

13. A method of operating a time-interleaved digital-to-analog converter (TIDAC) for an optical transmitter, the method comprising:

supplying current from a plurality of current sources to respective slices of a DAC core, the current being configured to convert complementary digital data signals to analog signals at output nodes of the DAC core;

connecting, for each slice of the DAC core, a current from a corresponding one of the current sources to either a first data input path or a second data input path of the DAC core, the first data input path corresponding to first complementary data signals supplied to the slice of the DAC core and the second data input path corresponding to second complementary data signals supplied to the slice of the DAC core;

connecting the current to the output nodes of the DAC; and for each slice of the DAC core, selectively connecting the current received from the corresponding one of the current sources and either the first data input path or the second data input path such that each of the current sources supplies current for the first complementary data signals and the second complementary data signals.

14. The method of claim 13, further comprising:
providing N/2 of the current sources;
providing N/2 of the slices of DAC core based on the N/2 current sources respectively for converting N complementary data signals in sequential time order to analog signals at output nodes of the DAC core;

coupling a down switch circuitry comprising one pair of switches per slice of the DAC core to the N/2 current sources;

controlling the pair of switches of the down switch circuitry in the slice of the DAC core respectively using a respective pair of N/2 complementary clock signals to connect a current from one of the N/2 current sources to either the first data input path or the second data input path;

configuring an up switch circuitry with four pairs of switches per slice of the DAC core; and configuring a data switch circuitry with two pairs of data switches per slice of the DAC core to alternately connect the current from the first data input path or the second data input path to the output nodes of the DAC.

15. The method of claim 14, further comprising providing the N/2 pairs of complementary clock signals in the up switch circuitry and the down switch circuitry as a series of clock signals with clock phases sequentially delayed relative to one another.

16. The method of claim 15, wherein controlling the pair of switches in the down switch circuitry per slice of the DAC core comprises driving the pair of switches in an i-th slice of the DAC core by an (i+1)-th pair of the N/2 complementary clock signals to alternatively connect an i-th one of the N/2 current sources to either the first data input path or the second data input path in the i-th slice of the DAC core, wherein i varies from 1 to N/2, and the pair of switches in the N/2-th slice of the DAC core is driven by a first pair of the N/2 complementary clock signals.

17. The method of claim 16, wherein configuring the data switch circuitry per slice of the DAC core comprises supplying a first pair of the N complementary data signals to the first pair of data switch in the i-th slice of the DAC core with an i-th pair of the N complementary data signals in an i-th order in time and supplying a second pair of the N complementary data signals in the same slice with a (N/2+i)-th pair of the N complementary data signals in a (N/2+i)-th time order with N/2 delays relative to the i-th order in time.

18. The method of claim 17, wherein configuring the up switch circuitry per slice of the DAC core comprises controlling each pair of switches of the up switch circuitry in an i-th slice of the DAC core by the i-th pair of the N complementary clock signals, wherein in the i-th slice of the DAC core the (i+1)-th pair of the N complementary clock signals for driving the pair of switches of the down switch circuitry has an i-th delay in clock phase relative to the i-th pair of the N complementary clock signals.

19. The method of claim 18, wherein controlling each pair of switches of the up switch circuitry in the i-th slice of the DAC core further comprises using the i-th delay in clock phase between a rising edge of a positive one of the i-th pair of the N complementary clock signals in the up switch circuitry and a falling edge of a negative one of the (i+1)-th pair of the N complementary clock signals in the down switch circuitry to select the i-th pair of complementary digital signals supplied in the data switch circuitry.

20. The method of claim 18, wherein controlling each pair of switches of the up switch circuitry in the i-th slice of the DAC core further comprises using the i-th delay in clock phase between a rising edge of a negative one of the i-th pair of the N complementary clock signals in the up switch circuitry and a falling edge of a positive one of the (i+1)-th pair of the N complementary clock signals in the down switch circuitry to select the (N/2+i)-th pair of complementary digital signals supplied in the data switch circuitry.

* * * * *